(12) United States Patent
Botez et al.

(10) Patent No.: US 9,096,948 B2
(45) Date of Patent: Aug. 4, 2015

(54) FABRICATION OF LOW-LOSS, LIGHT-WAVEGUIDING, ORIENTATION-PATTERNED SEMICONDUCTOR STRUCTURES

(75) Inventors: Dan Botez, Madison, WI (US); Thomas F. Kuech, Madison, WI (US); Luke J. Mawst, Sun Prairie, WI (US); Steven Christopher Ruder, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 341 days.

(21) Appl. No.: 13/562,560

(22) Filed: Jul. 31, 2012

(65) Prior Publication Data

US 2014/0037258 A1    Feb. 6, 2014

(51) Int. Cl.
| | |
|---|---|
| *G02B 6/10* | (2006.01) |
| *C30B 25/04* | (2006.01) |
| *C30B 29/40* | (2006.01) |
| *C30B 29/42* | (2006.01) |
| *C30B 29/44* | (2006.01) |
| *G02B 6/122* | (2006.01) |

(52) U.S. Cl.
CPC ............... *C30B 25/04* (2013.01); *C30B 29/403* (2013.01); *C30B 29/42* (2013.01); *C30B 29/44* (2013.01); *G02B 6/122* (2013.01)

(58) Field of Classification Search
None
See application file for complete search history.

(56) References Cited

U.S. PATENT DOCUMENTS

| 5,796,902 A * | 8/1998 | Bhat et al. ...................... 385/122 |
| 2012/0162748 A1 | 6/2012 | Fermann et al. |

OTHER PUBLICATIONS

Schunemann, Quasi-Phasematched Semiconductors for Mid-IR Frequency Conversion, Photonics Conference IEEE, Oct. 9-13, 2011, pp. 497-498.
Yu et al., Efficient continuous wave second harmonic generation pumped at 1.55 μm in quasi-phase-matched AlGaAs waveguides, Optics Express, vol. 13, No. 26, Dec. 26, 2005.
Sauvage et al., Normal-incidence (001) second-harmonic generation in ordered $Ga_{0.5}In_{0.5}P$, J. Opt. Soc. Am. B, vol. 18, No. 1, Jan. 2001, pp. 81-84.
Oron et al., Efficient second-harmonic generation and modal dispersion effects in orientation-patterned GaAs waveguides, Optics Letters, vol. 35, No. 16, Aug. 15, 2010, pp. 2678-2680.
Rivoire et al., Second harmonic generation in GaP photonic crystal waveguides, Applied Physics Letters, vol. 98, No. 263113, Jul. 1, 2011, pp. 1-3.
Yu et al., Template design and fabrication for low-loss orientation-patterned nonlinear AlGaAs waveguide pumped at 1.55 μm, Journal of Crystal Growth, vol. 251, Apr. 2003, pp. 794-799.

(Continued)

*Primary Examiner* — Uyen Chau N Le
*Assistant Examiner* — Chad Smith
(74) *Attorney, Agent, or Firm* — Bell & Manning, LLC (57) ABSTRACT

Methods for the fabrication of orientation-patterned semiconductor structures are provided. The structures are light-waveguiding structures for nonlinear frequency conversion. The structures are periodically poled semiconductor heterostructures comprising a series of material domains disposed in a periodically alternating arrangement along the optical propagation axis of the waveguide. The methods of fabricating the orientation-patterned structures utilize a series of surface planarization steps at intermediate stages of the heterostructure growth process to provide interlayer interfaces having extremely low roughnesses.

13 Claims, 2 Drawing Sheets

(56) References Cited

OTHER PUBLICATIONS

Oron et al., Periodically oriented GaAs templates and waveguide structures for frequency conversion, Proc. of SPIE, vol. 6875, No. 68750F, Feb. 13, 2008, pp. 1-12.

Li et al., Wafer-fused orientation-patterned GaAs, Presented at SPIE Photonics West, Jan. 19-24, 2008, San Jose, CA.

Botez et al., Light-Waveguiding Structure with Orientation Patterned GaAs for Generation of Mid-Infrared Radiation, Presentation at The 18th American Conference on Crystal Growth and Epitaxy, Jul. 31-Aug. 5, 2011, Monterey, California.

Botez et al., Light-Waveguiding Structure with Orientation Patterned GaAs for Generation of Mid-Infrared Radiation, Abstract for Presentation at The 18th American Conference on Crystal Growth and Epitaxy, Jul. 31-Aug. 5, 2011, Monterey, California.

* cited by examiner

FABRICATION OF LOW-LOSS, LIGHT-WAVEGUIDING, ORIENTATION-PATTERNED SEMICONDUCTOR STRUCTURES

REFERENCE TO GOVERNMENT RIGHTS

This invention was made with government support under FA8650-10-C-1894 awarded by the US Air Force/ESC. The government has certain rights in the invention.

BACKGROUND

Orientation-Patterned GaAs (OPGaAs) waveguide structures are promising devices for mid-infrared (IR) nonlinear conversion since tight optical confinement to a highly nonlinear medium allows high-frequency conversion efficiency of CW sources. The use of OPGaAs for IR and THz generation has been successfully realized by using MBE-grown templates. (See, Yu, X., Scaccabarozzi, L., Levi, O., Pinguet, T. J., Fejer. M. M. and Harris Jr., J. S., "Template design and fabrication for low-loss orientation-patterned nonlinear AlGaAs waveguides pumped at 1.55 µm", *J. Cryst. Growth*, 251, April 2003, pp. 794-799.) However, the templates so created had a periodic depth variation between alternate regions of differing crystalline orientation, the so-called trench depth, of ~1500 Å. Since crystal growth on the templates was highly anisotropic the result was a top surface composed of ~50 µm-tall triangular features that occurred periodically.

OPGaAs templates have also been obtained using wafer diffusion bonding and selected-layer removal. (See, Oron, M. B., Shusterman, S, and Blau, P., "Periodically oriented GaAs templates and waveguide structures for frequency conversion", *Proc. SPIE*, 6875, February 2008, 68750F.) Using this technique, the trench depth was reduced to values of ~900 Å. The crystal growth technique used was metal-organic vapor-phase epitaxy (MOVPE), which transferred the template's periodic depth variation to the grown layers. Ridge-type waveguides were subsequently fabricated on templates of 900 Å trench depth, and the waveguide-loss coefficient, $\alpha_w$, at a wavelength of 1.6 µm, was measured to be in the 3-5 dB/cm range.

Using templates of 600-800 Å trench depth, the $\alpha_w$ value was lowered to typical values of 1.3-1.5 dB/cm at 1.6 µm wavelength, while the periodic trench depth was still transferred to the waveguide layers with some variation in the channel profile. (See, Oron, M. B. Blau, P., Pearl, S, and Katz, M., "Optical parametric oscillation in orientation patterned GaAs waveguides", *Proc. SPIE*, 8240, February 2012, 82400C.)

SUMMARY

Methods for fabricating waveguiding, orientation-patterned semiconductor structures and semiconductor structures made using the methods are provided.

The structures are grown on a growth template comprising a first set of template domains comprising a material having a first crystalline orientation and second set of template domains comprising the material, but having a second crystalline orientation, wherein the domains of the first set and the domains of the second set are disposed in a periodically alternating arrangement along the optical propagation axis of the structure. One embodiment of the present methods for the fabrication of orientation-patterned semiconductor structures comprises: (a) optionally, growing a layer of buffer material on the growth template, wherein the layer of buffer material comprises a first set of buffer layer domains grown on the first set of template domains and having a first crystalline orientation and a second set of buffer layer domains grown on the second set of template domains and having a second crystalline orientation; (b) if a layer of buffer material is grown on the growth template, planarizing the top surface of the layer of buffer material using a chemical polish followed by an isotropic etch; (c) growing a lower layer of cladding material on the growth template or, if present, on the layer of buffer material, wherein the lower layer of cladding material comprises a first set of lower cladding layer domains grown on the first set of template domains or, if present, on the first set of buffer layer domains and having a first crystalline orientation and a second set of lower cladding layer domains grown on the second set of template domains or, if present, on the second set of buffer layer domains and having a second crystalline orientation; (d) planarizing the top surface of the lower layer of cladding material using a chemical polish followed by an isotropic etch; (e) growing a layer of core material on the lower layer of cladding material, wherein the layer of core material comprises a first set of core layer domains grown on the first set of lower cladding layer domains and having a first crystalline orientation and a second set of core layer domains grown on the second set of lower cladding layer domains and having a second crystalline orientation; (f) planarizing the top surface of the layer of core material using a chemical polish followed by an isotropic etch; (g) growing an upper layer of cladding material on the layer of core material, wherein the upper layer of cladding material comprises a first set of upper cladding layer domains grown on the first set of core layer domains and having a first crystalline orientation and a second set of upper cladding layer domains grown on the second set of core layer domains and having a second crystalline orientation; (h) growing a layer of ridge material on the upper layer of cladding material, wherein the layer of ridge material comprises a first set of ridge layer domains grown on the first set of upper cladding layer domains and having a first crystalline orientation and a second set of ridge layer domains grown on the second set of upper cladding layer domains and having a second crystalline orientation; and (i) planarizing the top surface of the layer of ridge material using a chemical polish followed by an isotropic etch; and (j) fabricating a waveguide ridge from the planarized layer of ridge material.

One embodiment of a light-waveguiding, orientation-patterned semiconductor structure comprises: (a) a growth template comprising a first set of template domains comprising a material having a first crystalline orientation and second set of template domains comprising the material having a second crystalline orientation, wherein the domains of the first set and the domains of the second set are disposed in a periodically alternating arrangement along the optical propagation axis of the structure; (b) optionally, a layer of buffer material on the top surface of the growth template, wherein the layer of buffer material comprises a first set of buffer layer domains disposed on the first set of template domains and having a first crystalline orientation and a second set of buffer layer domains disposed on the second set of template domains and having a second crystalline orientation; (c) a lower layer of cladding material on the top surface of the growth template or, if present, on the layer of buffer material; wherein the lower layer of cladding material comprises a first set of lower cladding layer domains disposed on the first set of template domains or, if present, on the first set of buffer layer domains and having a first crystalline orientation and a second set of lower cladding layer domains disposed on the second set of template domains or, if present, on the buffer layer domains and having a second crystalline orientation; (d) a layer of core material on the top surface of the lower layer of cladding material; wherein the layer of core material comprises a first set of core layer domains disposed on the first set of lower cladding layer domains and having a first crystalline orientation and a second set of core layer domains disposed on the second set of lower cladding layer domains and having a second crystalline orientation; (e) an upper layer of cladding material on the top surface of the layer of core material; wherein the upper layer of cladding material comprises a first set of upper cladding layer domains disposed on the first set of core layer domains and having a first crystalline orientation and a second set of upper cladding layer domains disposed on the second set of core layer domains and having a second crystalline orientation; and (f) a waveguide ridge on the top surface of the layer of upper cladding material; wherein the waveguide ridge comprises a first set of domains disposed on the first set of upper cladding layer domains and having a first crystalline orientation and a second set of ridge domains disposed on the second set of upper cladding layer domains and having a second crystalline orientation; wherein the top surface of the layer of buffer material, the top surface of the lower layer of cladding material, the top surface of the layer of core material and the top surface of the waveguide ridge each have an rms roughness of no greater than 10 nm.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1: Light-waveguiding, orientation-patterned structure: (A) schematic perspective view; (B) cross-sectional view with the optical-mode profile shown for the 2-D waveguide.

DETAILED DESCRIPTION

Methods for the fabrication of orientation-patterned semiconductor structures are provided. The structures are light-waveguiding structures for efficient, nonlinear frequency conversion and, in some embodiments, are able to generate light in the visible, near- or mid-IR regions of the electromagnetic spectrum with single spatial mode operation. The structures are periodically poled semiconductor heterostructures comprising a series of domains disposed in a periodically alternating arrangement along the optical propagation axis of waveguide. In this arrangement, adjacent domains differ in their crystallographic orientation, but not in their refractive indices, such that, ideally, light scattering would not occur at the domain boundaries.

The methods of fabricating the orientation-patterned structures utilize a series of surface planarization steps at intermediate stages of the heterostructure growth process to provide interlayer interfaces having extremely low roughnesses. As a result of the planarization steps, which include a combination of chemical polishing and isotropic etching, the thickness variation (corrugation) at the top surface of each planarized layer is reduced, thereby providing very smooth waveguide layer interfaces. This reduction in interfacial roughness results in a substantial decrease in optical losses and a substantial increase in nonlinear frequency conversion efficiency.

Figure 1A:
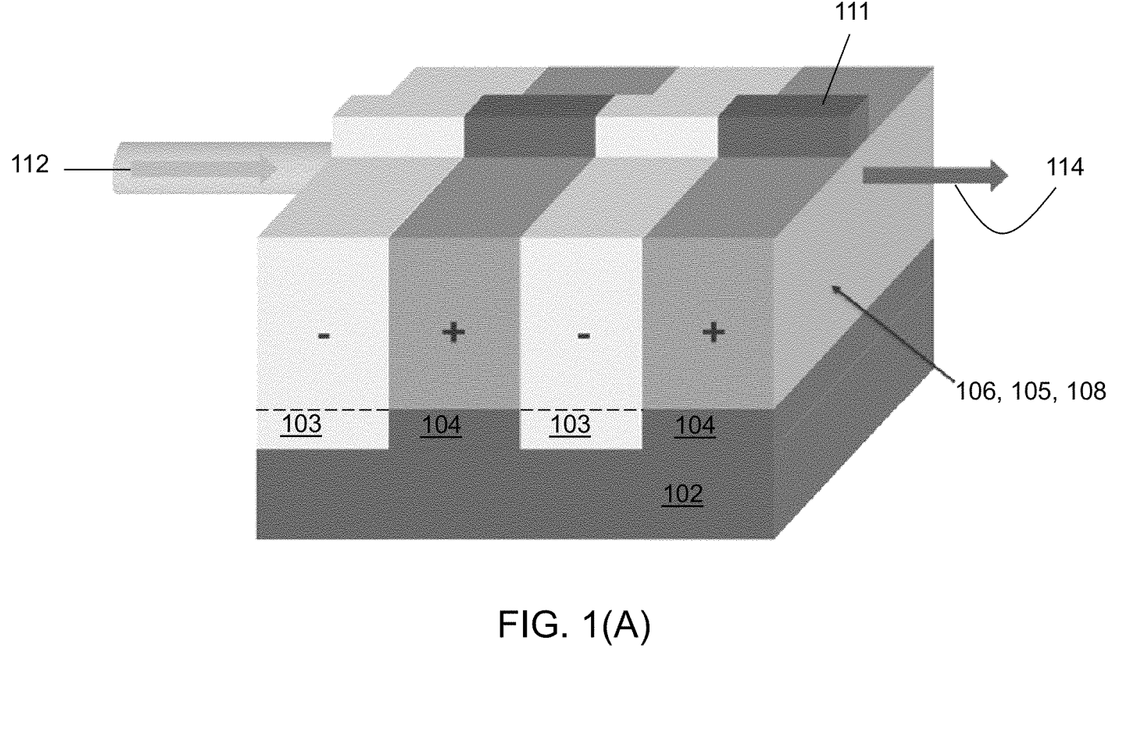
Figure 1B:
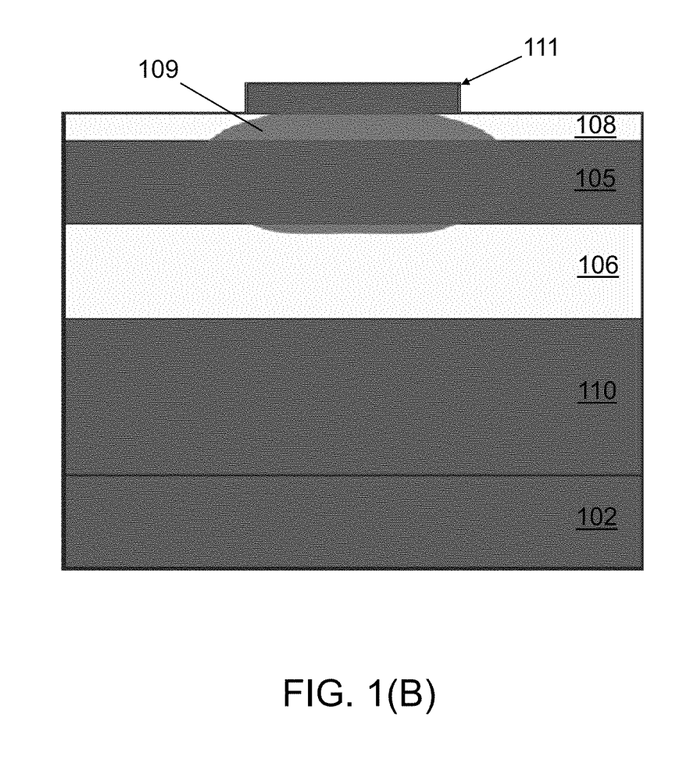

An illustrative embodiment of an orientation-patterned semiconductor structure that can be fabricated using the present methods is shown in the schematic diagram of FIGS. 1(A) and (B). FIG. 1(A) shows a perspective view of the structure, while FIG. 1(B) shows a cross-sectional view of the structure taken along the optical propagation axis of the waveguide. (In the embodiment depicted in FIGS. 1(A) and (B), the waveguide includes a single high-refractive-index ridge. However, other lateral waveguide designs can be used. For example, lateral optical-mode confinement can be obtained by using several ridges, to form, for instance, antiresonant reflective optical waveguide (ARROW)-type structures, or by using buried-heterostructure configurations for which a ridge or ridges are embedded in the structures via crystal regrowth.) The bottom layer in the structure is a growth template 102, upon which the waveguide can be epitaxially grown. Growth template 102 defines a series of periodically alternating domains, wherein adjacent domains have the same material composition, but different crystalline orientations. In particular, growth template 102 comprises a first set of template domains 103 comprising a material having a first crystalline orientation and a second set of domains 104 of the same material having a second crystalline orientation, wherein the domains of the first set are interspersed between the domains of the second set. The growth templates can be made, for example, via molecular beam epitaxy (MBE) growth, as described in Yu, X., Scaccabarozzi, L., Levi, O., Pinguet, T. J., Fejer. M. M. and Harris Jr., J. S., "Template design and fabrication for low-loss orientation-patterned nonlinear AlGaAs waveguides pumped at 1.55 µm", *J. Cryst. Growth,* 251, April 2003, pp. 794-799, or by wafer bonding and etchback.

As used herein, the terms "first crystalline orientation" and "second crystalline orientation" are used to refer to two materials having different crystalline orientations; that is, the first crystalline orientation is not the same as the second crystalline orientation.

The waveguide structure grown on the growth template comprises a layer of core material 105 sandwiched between a lower layer of cladding material 106 and an upper layer of cladding material 108. The material of the core layer allows a large part of the light of the desired wavelengths to propagate therethrough and the materials of the lower and upper cladding layers have lower indices of refraction than the core material, such that they confine a large part of the optical modes of the core layer in the transverse direction; that is, the direction perpendicular to the heterostructure layers. In the embodiment depicted here, the waveguide further includes a longitudinal high-refractive-index ridge 111 projecting from the upper cladding layer and running along the direction of light propagation. The ridge causes light confinement in the lateral direction; that is, the direction parallel to the heterostructure layers. Thus, the optical mode is confined in two directions; that is, the structure is a two-dimensional waveguide, as shown in FIG. 1(B). In this design, the composition and thicknesses of the ridge and cladding layers are desirably selected to provide for a 2-D, single spatial optical mode 109 operation.

A layer of buffer material 110 may be grown over growth template 102, the composition of which allows for the epitaxial growth of the subsequently grown waveguide layers. In addition, buffer layer 110 can be used to minimize or prevent the propagation of domain boundary defects from growth template 102 into the layers subsequently grown thereon, as described in greater detail below.

As the semiconductor heterostructure undergoes layer by layer epitaxial growth, the periodically alternating domain structure of the growth template is carried through the other layers, such that each layer defines a plurality of alternating domains in which adjacent domains have different crystalline orientations.

The heterostructures may be fabricated from semiconductors including, but not limited to Group III-V semiconductors or Group II-VI semiconductors. For example, the various layers can comprise GaAs, GaP and/or GaN semiconductor materials. For purposes of clarification, the phrase "comprising GaAs" and like phrases indicate that the material may be GaAs (wherein the ratio of Ga:As may vary) or may be an alloy of GaAs with one or more additional elements, such as AlGaAs (wherein the ratio of Al:Ga:As may vary). Examples of material systems from which the heterostructures can be fabricated—presented in the layer order of growth template/buffer layer/lower cladding/core/upper cladding/ridge—include: GaAs/GaAs (or AlGaAs)/AlGaAs (Ga-rich)/GaAs/AlGaAs (Ga-rich)/GaAs; GaAs/GaAs/AlGaAs (Ga-rich)/AlGaAs/AlGaAs (Ga-rich)/GaAs; and GaAs/GaAsP/AlGaP (Ga-rich)/GaP/AlGaP (Ga-rich)/GaP. In some embodiments, the entire structure may be composed on semiconductor materials that are free of aluminum, such that the entire structure can be grown using HYPE. For example, GaAs can be used as an Al-free core material and InGaP (lattice matched to GaAs) can be used as an Al-free cladding material.

The appropriate thickness range for each layer in the structure can vary provided it is suitable to allow that layer to carry out its intended function. The optimal thickness will depend on a variety of factors including material composition, method of growth and/or the thickness of the other layers in the structure. Typically, each layer of the waveguide portion of the heterostructure will have a thickness in the range from about 0.2 to about 6 μm. However, thicknesses outside of this range are possible.

By way of illustration, specific examples of suitable materials for three embodiments of a waveguiding, orientation-patterned semiconductor structure are provided in Table 1. For Structure A, illustrative layer thicknesses are also provided.

TABLE 1

| Layer | Structure A Material | Structure A Thickness (μm) | Structure B Material | Structure C Material |
|---|---|---|---|---|
| Ridge | GaAs | 1.5 | GaP | GaP |
| Upper Cladding | $Al_{0.25}Ga_{0.75}As$ | 0.5 | $Al_{0.25}Ga_{0.75}P$ | $Al_{0.25}Ga_{0.75}P$ |
| Core | GaAs | 3 | GaP | GaP |
| Lower Cladding | $Al_{0.3}Ga_{0.7}As$ | 5 | $Al_{0.3}Ga_{0.7}P$ | $Al_{0.3}Ga_{0.7}P$ |
| Buffer | GaAs | | $GaAs_xP_{1-x}$ | GaP |
| Growth Template | OPGaAs | | OPGaAs | OPGaP |

Structure A in Table 1 is designed to support only the fundamental lateral mode at wavelengths of 2.0 μm, 4.0 μm and 5.5 μm. The waveguide supports the fundamental mode over a 4-14 μm range in ridge width, W. In contrast, the 2-D effective index of the first-order lateral mode lies below the effective index in the regions outside the ridge and, thus, is not supported for any value of W in the 4-14 μm range.

Structure B in Table 1 is designed to produce efficient second harmonic generation (SHG) light in the green spectral region (i.e., wavelengths around 530 nm). A conventional high-performance diode-pumped laser at 1060 nm can be employed and efficiently coupled into the quasi-phase matched (QPM)-waveguide device. For yellow-green emission, materials such as $Al_xGa_{1-x}P/GaP$ can be employed in order to avoid excessive optical absorption at those wavelengths. While there are only a few reports on the non-linear optical properties of GaP, the high symmetry of III-V zinc blende semiconductors is known to lead to the existence of a nonlinear coefficient ($d_{14}$) for the second-order susceptibility tensor. However, these materials have a smaller lattice constant than that of GaAs substrates. Due to the lattice mismatch, the growth of such materials on GaAs will typically result in excessively large dislocation densities (~$10^9$ cm$^{-3}$) which in turn would lead to high optical-scattering losses in the waveguide structure. To avoid this, a compositionally graded metamorphic buffer layer (MBL) can be used, allowing for slowly grading the lattice constant from the OPGaAs template to higher-energy-bandgap, (Al)GaP-based materials. Such MBLs can have a step-graded $GaAs_xP_{1-x}$ structure grown by either MOVPE or HYPE. Then, the waveguide structure grown by MOVPE on top of the MBL will have significantly reduced threading dislocation density (~$10^4$-$10^6$ cm$^{-3}$).

An alternate approach (Structure C) illustrates the use of direct growth on a OPGaP substrate instead of an OPGaAs substrate. The advantage of such an approach is that the waveguide materials can be grown nominally lattice-matched without the need to employ a thick MBL. Such an OPGaP template can be produced by using similar techniques to those that are currently employed for the fabrication of OPGaAs templates.

The light-waveguiding, orientation-patterned structures can be fabricated using epitaxial growth techniques combined with a chemical polish followed by an isotropic etch after the epitaxial growth of at least some of the layers in the structures. Following the polishing and etching steps, the planarized surface may have an rms roughness of 10 nm or less. This includes embodiments in which the planarized surface has an rms roughness of 8 nm or less; of 6 nm or less; of 5 nm or less; of 4 nm or less.

As used herein, the term chemical polish refers to a process in which a polishing substrate, such as a pad (e.g., a polyurethane pad) having a chemical polishing solution disposed thereon or therein is pressed against a surface to be polished while undergoing a polishing motion, such as rotation, whereby the resulting rubbing and/or friction between the two surfaces reduces the roughness of the surface being polished. As used herein, the term chemical polishing includes chemical mechanical polishing in which particulate mechanical polishing agents, such as colloidal silica, are added to the chemical polishing solution.

The isotropic etching step carried out during the surface planarization process can be a wet chemical etch, a dry vapor etch or a combination thereof. Unlike polishing, etching does not rely on surface contact or rubbing to achieve a reduction in surface roughness. For a given etching protocol, an etch will be considered to be isotropic if it provides the desired low rms roughness to the etched surface. The etching step follows the polishing step in order to remove or significantly reduce morphological damage caused by the polishing step.

In a wet chemical etch, a surface is exposed to a liquid-phase solution comprising a chemical etchant that dissolves the material to be etched. The chemical etchant is commonly an acid, such as phosphoric acid or sulfuric acid, in a solvent, such as water or an organic solvent. In a dry vapor etch, a surface is exposed to a vapor-phase environment comprising a vapor-phase chemical etchant that dissolves the material to be etched, typically at a high temperature (e.g., a temperature in the range from about 500° C. to about 900° C.). HCl is one example of a suitable vapor phase etchant.

The following description illustrates the use of the present methods to fabricate the waveguide structure of FIG. 1, using a planarization step after the epitaxial growth of each of the buffer layer, the lower cladding layer, the core layer, and the ridge layer. However, in some embodiments of the methods one or more of these intervening planarization steps may be omitted. The initial step in the process is the epitaxial growth of a layer of buffer material on the periodically poled growth template. The epitaxial growth can be carried out using methods such as metal organic chemical vapor deposition (MOCVD) or, in the case of materials that do not comprise aluminum, hydride vapor phase epitaxy (HVPE). However, in at least some embodiments, HVPE is preferred due to its ability to prevent or minimize domain boundary defects, which are frequently present in the original growth template, from propagating through the subsequently grown layers of the heterostructure. The ability of an HVPE-grown buffer layer to mitigate the effect of growth template defects, is illustrated in Example 2, below. Once the layer of buffer material is grown, its top surface (i.e., the surface upon which the next layer in the heterostructure is grown) is polished using a chemical polish, such as a chemical mechanical polish. This is followed by an isotropic etch, which may comprise a wet chemical etch or a dry vapor etch.

Next, a layer of lower cladding material is grown on the top surface of the layer of buffer material. Epitaxial growth of the lower cladding layer can be carried out, for example, using MOCVD or, in the case of materials that do not comprise aluminum, HVPE. Again, once the layer of buffer material is grown, its top surface is polished using a chemical etch, such as a chemical mechanical etch. This is followed by an isotropic etch, which may comprises a wet chemical etch or a dry vapor etch. However, in some embodiments, a high temperature dry vapor etch is particularly well-suited for achieving an isotropic etch. In structures where the lower cladding layer (or another layer) in the heterostructure is readily oxidized, it may be desirable to conduct the etching step in situ followed by the in situ growth a thin layer of material that prevents subsequent oxidation. In some embodiments, the material of this thin layer is the same material as that used for the next functional layer in the heterostructure. For example, in the embodiment described here, the thin layer grown in situ over the lower cladding layer can be a layer of waveguide core material that provides a growth front for the remainder of the waveguide core. As used here, the term in situ is used to indicate that the etching and subsequent thin layer growth steps are conducted without an intervening step that would expose the layer to an oxidizing environment. Thus, the etching and thin-layer growth steps may be conducted under a non-oxidizing atmosphere/ambient such as high-purity hydrogen or nitrogen.

Once the lower layer of cladding material is planarized, a layer of waveguide core material is grown on its top surface. Like the layer of cladding material, the layer of core material can be grown epitaxially using methods such as MOCVD or, in the case of materials that do not comprise aluminum, HVPE then subsequently planarized using a chemical polish followed by an isotropic wet or dry chemical etch.

An upper cladding layer is then grown on the top surface of the core layer, followed by the growth of a layer of ridge material. Because the upper cladding layer is typically quite thin (e.g., ≤1 μm), the layer of ridge material may be grown without first planarizing the top surface of the layer of cladding material. However, in some embodiments, intermediate chemical polishing and isotropic wet or dry vapor chemical etching steps are used prior to the growth of the ridge material. Once the layer of ridge material has been grown, it is planarized using a chemical polish followed by an isotropic chemical etch. Then, a longitudinal ridge can be defined in that material using, for example, known lithographic techniques and a combination of dry etching and wet chemical etching that is isotropic, in order to achieve low rms surface roughness and straight, smooth waveguide ridge sidewalls.

For purposes of clarification, in some embodiments, an intermediate layer of material may be grown over one of the structural layers referred to in the description above in order to facilitate the processing of the waveguide structure. For example, in some embodiments, one or more intermediate layers of etch stop material may be included in the structure. In such embodiments, the step of growing a second layer (e.g., a layer of ridge material) 'on' a first layer (e.g., an upper cladding layer) includes a step in which the second layer is actually grown directly on an intermediate layer (e.g., an etch stop layer) that facilitates semiconductor processing.

The waveguides fabricated using the present methods can be used to generate radiation via nonlinear frequency conversion, as shown schematically in FIG. 1(A). In a basic method for using the waveguides for this purpose, input radiation 112 from an input radiation source, such as a pump laser or optical fiber, is directed into one end of the waveguide along the axis of optical propagation and the frequency-converted output radiation 114 exits the waveguide at its opposing end. The frequency converted output can then be collected and/or redirected for downstream applications. Depending upon the materials used in the semiconductor waveguide heterostructure, the present waveguides can be use to generate coherent radiation via non-linear optical processes, such as second harmonic generation and difference frequency generation, over a broad range of frequencies, including the visible, near- and mid-infrared regions of the electromagnetic spectrum. The frequency converted output may find uses in such applications as laser projection and displays, spectroscopy, optical communications, remote sensing and infrared countermeasures.

EXAMPLES

Example 1

Intermediate Interface Planarization During Heterostructure Growth

This example describes the growth of a waveguiding structure having a GaAs core, AlGaAs cladding layers, a GaAs buffer layer and a GaAs waveguide ridge. Each of the semiconductor layers was grown via MOVPE as follows. A vertical-chamber MOVPE (Thomas Swan/Aixtron 3×2 reactor, with a close-coupled showerhead gas-delivery system) was used to grow the AlGaAs or GaAs films on a OPGaAs growth template. The reactor pressure and growth temperature were fixed at 100 Torr and 700° C. Trimethyl aluminum (TMAl) and trimethyl gallium (TMGa) were used as group-III precursors, while arsine ($AsH_3$) was used as the group-V source. The TMAl bubbler pressure was set at 1000 Torr, with a bubbler temperature of 17° C. The TMGa bubbler pressure was set at 1000 Torr, with a bubbler temperature of −10° C. The molar flow rate of TMGa and TMAl was $5.45 \times 10^{-5}$ mol/min and $2.41 \times 10^{-5}$ mol/min, respectively. The growth rates for the bulk AlGaAs and GaAs materials were 4.2 μm/hr and 2.8 μm/hr, respectively. High-resolution X-ray diffraction (HRXRD), ω-2θ rocking curves around the (004) reflection, were used to determine the out-of-plane lattice parameter for AlGaAs films. In order to determine the Al content of $Al_xGa_{1-x}As$ films the X-ray rocking-curve diffraction angle derived by using Gehrsitz et al.'s polynomial expression for the lattice constant as a function of the Al content, x, was employed. (See Gehrsitz, S., Reinhart, F. K., Gourgon, C., Herres, N., Vonlanthen, A. and Sigg, H., "The refractive index of $Al_xGa_{1-x}As$ below the band gap: Accurate determination and empirical modeling", *J. Appl. Phys.*, 87, June 2000, pp. 7825-7837.)

Following growth, the buffer layer, lower cladding layer, core layer and ridge material layer underwent a chemical mechanical polish (CMP) followed by an isotropic chemical etch. Witness templates were used to determine layer thicknesses achieved by polishing, and the quality of the layers' top surfaces after polishing and isotropic chemical etching (e.g., measuring the rms roughness value for those layers' top surfaces).

In preparation for polishing, the actual and witness templates were bonded to a handle wafer using a bonding medium of Apiezon W Wax dissolved in trichloroethylene (TCE): ~1 g wax/9 g TCE. A given template was bonded to a 2"-diameter silicon handle wafer using Apiezon W wax. This type of wax was used for its ease in bonding and debonding, mostly due to its solubility in Ecoclear and TCE. The dissolved wax was sandwiched between the silicon handle wafer and the template, which were pressed together between lapped-flat glass plates using ~1 kg of weight, until the dissolved wax dried. Heating the sample to ~100° C. decreased the drying time of the wax. The bonding step took about 1 hour, but could easily be increased by increasing heating and cooling rates. (Note: This bonding/mounting process was carried out so that, during the CMP process, the structures would not break.)

CMP was performed on the GaAs buffer layers of the actual and witness structures using a Logitech CDP1-SCH polishing tool. The samples were mounted in the CMP carrier head and held in place using ethane diol surface tension. The polishing pad was Eminess Suba X II 20, rotated at 50 rpm, and the polishing slurry was a mixture of 96% Eminess Ultra-Sol 556 Colloidal Silica and 4% Clorox bleach. The bleach was added to the slurry, which was then continuously stirred during mixing and throughout the process using a Teflon-coated magnetic stir bar. The slurry was fed at a rate of 50 mL/min. The samples were rotated at 40 rpm and polished with 2 psi of pressure applied to the carrier head. After CMP, the samples were kept wet to prevent particulates from adhering to the surfaces. The samples were sonicated for approximately 30 seconds, dipped in hydrofluoric acid (49-51%) for 2 minutes, rinsed in DI water, rinsed in isopropanol, and blow-dried with nitrogen gas.

The typical material removal rate was ~2.0 μm/min when the slurry had a fresh bleach content. Since the removal rate is a function of pad wearout as well as the amount of bleach in the slurry, one should periodically check the removal rate by growing two-layer test samples composed of an ~0.5 μm-thick InGaP and an ~4.0 μm-thick GaAs layer. The GaAs layer is used for CMP (the removal rate is the same, for a given set of conditions, for both GaAs and AlGaAs) while the thin InGaP layer is used as a marker, for determining the thickness of the remaining GaAs layer after CMP, from SEM cross-sectional photographs.

The CMPed templates were then debonded from the Si handle wafers. If the wax layer was sufficiently thin, sonication debonded the structures from the Si handle wafer. The excess wax was then cleaned off with a TCE rinse and UV ozone. If the structures did not debond with sonication, they were debonded by submerging the sample/handle wafer in Ecoclear. The Ecoclear was heated to ~80-100° C. After some time, the structures debonded and the solution was cooled, and then rinsed in TCE to remove any remaining wax. Remaining organic surface contaminants were removed by incubation in UV-generated ozone for one hour. The sample was then dipped in hydrofluoric acid (49-51%) for 2 mins, rinsed in DI water, rinsed in isopropanol, and blow-dried with nitrogen gas.

A piece of the witness template was then cleaved to verify the thickness of the CMPed layer via SEM. The same piece of witness template was used for: a) checking the surface quality using a Nomarski microscope (i.e., checking if pit-like defects were present), and b) determining the rms roughness using atomic force microscopy (AFM).

Next, a wet chemical etch was carried on the witness and actual structures in order to remove any mechanical damage caused during CMP. The etch solution used was: $H_3PO_4$:$H_2O_2$:$H_2O$ (3:1:125), which is isotropic with respect to the domains of differing crystalline orientation. The etch rate was ~0.025 μm/min.

A cladding layer of $Al_{0.3}Ga_{0.7}As$ was grown in situ followed by in situ regrowth of a thin layer of GaAs, for both the actual and witness structures, in a custom-made, horizontal-flow MOVPE reactor with an induction-heated graphite susceptor, by using HCl gas diluted to a ratio of 0.1% and employing an HCl-gas filter. Initially the filter/purifier needed to be conditioned by exposing it to concentrated HCl to saturate it, and then running it until the etch rate stabilized. The stabilization typically took ~5 hours.

After in-situ etching ~0.1 μm of $Al_{0.3}Ga_{0.7}As$ for a duration of ~300 sec, the transition to in-situ growth of GaAs consisted of abruptly introducing a high concentration of arsine at the reactor head, which effectively halted the etching process. Then, the HCl flow was stopped and the TMGa flow was introduced in the same abrupt fashion as the arsine, in order to reach the equilibrium V/III-ratio quickly. After regrowing ~0.5 μm of GaAs, at a growth rate of ~3.0 μm/hour, the TMGa flow was closed to the reactor and the sample was cooled under arsine. Table 2, below, displays the specific etch and regrowth conditions.

TABLE 2

|  | Etch Conditions | Growth Conditions |
| --- | --- | --- |
| Temperature | 750° C. | 750° C. |
| Pressure | 76 torr | 76 torr |
| HCl Flow | 0.126 sccm | — |
| TMGa Flow | — | 1.34 sccm |
| $AsH_3$ Flow | 0.25 sccm | 100 sccm |
| V/III$_{effective}$ | 2 | 74.5 |
| Total Flow | 6635 sccm | 6614 sccm |

Next, a 5 μm thick core layer of GaAs was grown via MOVCD on the witness and actual structures. The structures were then bonded to Si handle wafers and 2 μm was CMPed from the layers, as described previously. The witness structure was then debonded from the handle wafer, as described previously. A piece of the witness was then cleaved to verify the thickness of the CMPed layer via SEM. Verifying the thickness of this layer is important since it constitutes the waveguide core. If the thickness was much larger than the target thickness (e.g., 4.0-5.0 μm vs 3.0 μm), the thickness difference was removed using a CMP on the bonded structure. If the thickness was slightly thicker than the target value (e.g., 3.3-3.4 μm vs 3.0 μm) the target thickness for the ridge was increased (e.g., for a 3.2-3.4 μm-thick core the ridge height would be increased from the initial target value of 1.5 μm to ~2.0 μm). If the thickness was smaller than the target value (e.g., 2.0 μm vs 3.0 μm) a slightly shallower ridge was etched (e.g., for a 2.0 μm-thick core the ridge height would be decreased from the initial target value of 1.5 μm to ~1.4 μm). The same piece of witness template was used for: a) checking the surface quality using a Nomarski microscope (i.e., checking if pit-like defects were present), and b) determining the rms roughness using atomic force microscopy (AFM). Once it was determined that an appropriate core layer thickness had been achieved, the actual structure was debonded from the Si handle wafer using the previously described techniques.

A wet-etch was then used to remove 0.1 μm of material from the remainder of the witness structure and the actual structure. The etch solution used was: $H_3PO_4:H_2O_2:H_2O$ (3:1:125).

Next the upper-cladding layer and layer of ridge material were formed, followed by the formation of the waveguide ridge. A 0.5 μm thick layer of $Al_{0.25}G_{0.75}As$ cladding and a 4.0 μm thick layer of GaAs were grown via MOVCD on the witness and actual structures. The structures were then bonded to a Si handle wafer and 2 μm was CMPed from the layers, as described previously. The witness structure was then debonded from the handle wafer, as described previously. A piece of the witness was then cleaved to verify the thickness of the CMPed layer via SEM and, given the measured GaAs-layer thickness value, the bonded actual structure was CMPed to obtain a thickness corresponding to the planned ridge-guide height plus an extra 0.1 μm to be removed with a diluted $H_3PO_4$ chemical etch after CMP.

A wet chemical etch was then used to remove 0.1 μm of material from both a ¼ wafer of CMPed GaAs and from the actual structure. The etch solution used was: $H_3PO_4: H_2O_2: H_2O$ (3:1:125).

A 350 nm thick layer of $Si_3N_4$ was then deposited on both pieces via PECVD using a PlasmaTherm 70 PECVD/RIE under the following conditions: Flow rate (sccm):$N_2$:(2% $SiH_4$ in $N_2$):(5% $NH_3$ in $N_2$)=750:700:20; Temperature=250° C.; Power=25 W; Pressure=500 mT; and Deposition time=2000 s. The waveguide ridge was define photolithographically using an AZ 5214 resist spun on at 5500 rpm for 30 sec, prebaked on a hotplate at a temperature of 90° C. for 2 min, exposed on a Karl Suss MA6 aligner for 5 sec (Intensity=10 mW/cm²), developed in an AZ 327 developer for 40 sec followed by a deionized (DI) water rinse and drying in $N_2$.

The $Si_3N_4$ was removed from both pieces by reactive ion etching (RIE) using a Unaxis 790 under the following conditions: $CF_4$ 60 mT ($CF_4/O_2$=45 sccm/5 sccm; Pressure=60 mT; Power=100 W); and Etch time=2.5 min.

The photoresist was stripped using an acetone/isopropyl alcohol rinse, following by drying under $N_2$. An $O_2$ plasma cleaning was carried out in a Unaxis 790 under the following conditions: 150 W $O_2$ ($O_2$=40 sccm; Pressure=100 mT; Power=150 W); and an Etch time=6 min.

An inductively coupled plasma (ICP) etch of the GaAs ridge material was carried out using a pre-established ICP etching rate for 1+¼ GaAs wafer pieces. The ICP etch was conducted using a PlasmaTherm 770 ICP-RIE under the following conditions: GAAS10 (Pressure=2 mT; Flow rate=$BCl_3$: Ar=10 sccm:5 sccm; Power (RIE)=250 W; and Power (ICP)=500 W. The ¼ wafer piece was then cleaved and the ridge-guide height measured. If the ridge-guide height was not tall enough, the rest of the ridge was etched into the actual structure using ICP. Alternately, the ridge-guide height can be measured on the actual structure either in situ via Zygo or via alpha step. If it is not tall enough, the rest of the ridge can be etched, via an ICP etch, to the dry-etching target height.

Next, the actual structure was wet chemical etched with diluted $H_3PO_4$ for 8 minutes; that is, corresponding to a 0.2 μm-thick GaAs layer of material to be removed from outside the ridges and from the ridge sidewalls. After the etching the structure was rinsed in DI water and dried with $N_2$.

Finally, the $Si_3N_4$ was removed via RIE using an Unaxis 790 under the following conditions: $CF_4$ 60 mT ($CF_4/O_2$=45 sccm/5 sccm; Pressure=60 mT; Power=100 W); and an Etch time=3 min.

Example 2

Crystal Growth Via Hydride Vapor-Phase Epitaxy (HVPE)

Sometimes the MBE growth templates had severe defects at the domain boundaries. As a result, the initial GaAs layers grown on the templates were pitted. Even if most pits were removed via CMP, it was found that after further crystal growth the pits would reappear at the top surface of the next grown layer. Thus, in spite of repeated CMP steps, pits were found to vertically propagate through the whole grown waveguide structure.

An experiment was carried out on a ¼ wafer piece of semi-insulating (SI) MBE template: 6.0 μm of GaAs was grown via HVPE in an HVPE reactor. After the HVPE growth the pits virtually disappeared, even though the template had a large amount of defects at the domain boundaries. The important information out of this experiment was that the high-growth-rate HVPE growth method "healed" the defects of the template so that they would not continue to propagate through the grown structure.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for the fabrication of waveguiding, orientation-patterned semiconductor structures on a growth template, the growth template comprising a first set of template domains comprising a material having a first crystalline orientation and second set of template domains comprising the material having a second crystalline orientation, wherein the domains of the first set and the domains of the second set are disposed in a periodically alternating arrangement along the optical propagation axis of the structure, the method comprising:

optionally, growing a layer of buffer material on a growth template; wherein the layer of buffer material comprises a first set of buffer layer domains grown on the first set of template domains and having a first crystalline orientation and a second set of buffer layer domains grown on the second set of template domains and having a second crystalline orientation; and, if a layer of buffer material is grown, planarizing the top surface of the layer of buffer material using a chemical polish followed by an isotropic etch;

growing a lower layer of cladding material on the growth template or, if present, on the layer of buffer material; wherein the lower layer of cladding material comprises a first set of lower cladding layer domains grown on the first set of template domains or, if present, on the first set of buffer layer domains, and having a first crystalline orientation and a second set of lower cladding layer domains grown on the second set of template domains or, if present, on the second set of buffer layer domains, and having a second crystalline orientation;

planarizing the top surface of the lower layer of cladding material using a chemical polish followed by an isotropic etch;

growing a layer of core material on the lower layer of cladding material; wherein the layer of core material comprises a first set of core layer domains grown on the first set of lower cladding layer domains and having a first crystalline orientation and a second set of core layer domains grown on the second set of lower cladding layer domains and having a second crystalline orientation;

planarizing the top surface of the layer of core material using a chemical polish followed by an isotropic etch;

growing an upper layer of cladding material on the layer of core material; wherein the upper layer of cladding material comprises a first set of upper cladding layer domains grown on the first set of core layer domains and having a first crystalline orientation and a second set of upper cladding layer domains grown on the second set of core layer domains and having a second crystalline orientation; and growing a layer of ridge material on the upper layer of cladding material, wherein the layer of ridge material comprises a first set of ridge layer domains grown on the first set of upper cladding layer domains and having a first crystalline orientation and a second set of ridge layer domains grown on the second set of upper cladding layer domains and having a second crystalline orientation;

planarizing the top surface of the layer of ridge material using a chemical polish followed by an isotropic etch; and fabricating a waveguide ridge from the planarized layer of ridge material.

2. The method of claim 1, wherein, after each planarizing step, the planarized surface has an rms roughness of no greater than 10 nm.

3. The method of claim 2, wherein, after each planarizing step, the planarized surface has an rms roughness of no greater than 4 nm.

4. The method of claim 1, wherein the layer of buffer material is grown and the growth of the layer of buffer material is carried out by HVPE.

5. The method of claim 1, wherein the growth of all the semiconductor layers in the structure that do not comprise aluminum is carried out by HVPE.

6. The method of claim 5, wherein the core material comprises GaAs and the lower layer of cladding material and the upper layer of cladding material comprise InGaP.

7. The method of claim 1, wherein at least one isotropic etch is a wet chemical etch and at least one isotropic etch is a dry vapor etch.

8. The method of claim 1, wherein the isotropic etch of the layer of buffer material is a wet chemical etch; the isotropic etch of the lower layer of cladding material is a dry vapor etch; and the isotropic etch of the layer of core material is a wet chemical etch.

9. The method of claim 8, wherein the lower layer of cladding material comprises aluminum, the isotropic etch of the lower layer of cladding material is carried out in situ, and the method further comprises growing a layer of the core material on the etched lower layer of cladding material in situ.

10. The method of claim 1, wherein the buffer material, lower cladding material, core material and upper cladding material are each Group III-V semiconductor materials.

11. The method of claim 10, wherein the core material comprises GaAs.

12. The method of claim 8, wherein the buffer material comprises GaAs, the lower and upper cladding materials comprise AlGaAs, the core material comprises GaAs and the ridge material comprises GaAs, and further wherein the wet chemical etchant comprises $H_3PO_4$.

13. The method of claim 10, wherein the core material comprises GaP.

* * * * *